(12) United States Patent
Jang et al.

(10) Patent No.: US 11,670,716 B2
(45) Date of Patent: *Jun. 6, 2023

(54) SEMICONDUCTOR DEVICES

(71) Applicant: SAMSUNG ELECTRONICS CO., LTD., Suwon-si (KR)

(72) Inventors: Sung Uk Jang, Suwon-si (KR); Young Dae Cho, Suwon-si (KR); Ki Hwan Kim, Suwon-si (KR); Su Jin Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 18 days.

This patent is subject to a terminal disclaimer.

(21) Appl. No.: 17/337,759

(22) Filed: Jun. 3, 2021

(65) Prior Publication Data

US 2021/0296499 A1    Sep. 23, 2021

Related U.S. Application Data

(63) Continuation of application No. 16/708,717, filed on Dec. 10, 2019, now Pat. No. 11,031,502.

(30) Foreign Application Priority Data

Jan. 8, 2019   (KR) .................. 10-2019-0002425
Jan. 25, 2019  (KR) .................. 10-2019-0009967
Jun. 11, 2019  (KR) .................. 10-2019-0068893

(51) Int. Cl.
*H01L 29/78*    (2006.01)
*H01L 29/08*    (2006.01)
(Continued)

(52) U.S. Cl.
CPC ...... *H01L 29/7851* (2013.01); *H01L 29/0847* (2013.01); *H01L 29/42392* (2013.01); *H01L 29/78696* (2013.01)

(58) Field of Classification Search
CPC ............. H01L 29/7851; H01L 29/0847; H01L 29/42392; H01L 29/78696
See application file for complete search history.

(56) References Cited

U.S. PATENT DOCUMENTS 7,687,337 B2   3/2010 Zhang et al.
7,718,500 B2   5/2010 Chong et al.
(Continued)

OTHER PUBLICATIONS

U.S. Appl. No. 17/587,402, filed Jan. 28, 2022.
(Continued)

*Primary Examiner* — Changhyun Yi
(74) *Attorney, Agent, or Firm* — Lee IP Law, P.C.

(57) ABSTRACT

A semiconductor device includes an active region extending in a first direction on a substrate, channel layers on the active region and spaced apart vertically, a gate structure intersecting the active region and the channel layers, the gate structure extending in a second direction and surrounding the channel layers, and a source/drain region on the active region at a side of the gate structure, the source/drain region contacting the channel layers, the source/drain region including first epitaxial layers having a first composition and including first layers on side surfaces of the channel layers and a second layer on the active region at a lower end of the source/drain region, and a second epitaxial layer having a second composition different from the first composition, the second epitaxial layer being between the first epitaxial layers in the first direction and being between the first epitaxial layers vertically in a third direction.

20 Claims, 23 Drawing Sheets

(51) Int. Cl.
*H01L 29/786* (2006.01)
*H01L 29/423* (2006.01)

(56) References Cited

U.S. PATENT DOCUMENTS

| | | |
|---|---|---|
| 8,299,453 B2 | 10/2012 | Zhu |
| 8,785,285 B2 | 7/2014 | Tsai et al. |
| 9,034,741 B2 | 5/2015 | Adam et al. |
| 9,595,597 B1 | 3/2017 | Basker et al. |
| 9,673,324 B1 | 6/2017 | Wu et al. |
| 9,853,129 B2 | 12/2017 | Bauer et al. |
| 9,923,081 B1 | 3/2018 | Bao et al. |
| 9,941,405 B2 | 4/2018 | Kittl et al. |
| 9,997,613 B2 | 6/2018 | Chang et al. |
| 10,090,147 B2 | 10/2018 | Yan et al. |
| 10,109,533 B1 | 10/2018 | Xie et al. |
| 10,177,227 B1 | 1/2019 | Yoshida et al. |
| 11,031,502 B2 * | 6/2021 | Jang .................. H01L 29/36 |
| 2002/0045317 A1 | 4/2002 | Oishi et al. |
| 2003/0098479 A1 | 5/2003 | Murthy |
| 2005/0280098 A1 | 12/2005 | Shin et al. |
| 2009/0233411 A1 | 9/2009 | Ando |
| 2013/0234203 A1 | 9/2013 | Tsai |
| 2014/0138745 A1 | 5/2014 | Shin |
| 2017/0110554 A1 | 4/2017 | Tak et al. |
| 2017/0317169 A1 | 11/2017 | Bentley et al. |
| 2018/0040696 A1 | 2/2018 | Li et al. |
| 2018/0114834 A1 | 4/2018 | Cheng et al. |
| 2018/0175167 A1 | 6/2018 | Reboh et al. |
| 2018/0294331 A1 | 10/2018 | Cho et al. |
| 2018/0331232 A1 | 11/2018 | Frougier et al. |
| 2018/0366544 A1 | 12/2018 | Chang et al. |

OTHER PUBLICATIONS

U.S. Office Action dated Mar. 18, 2021—issued in co pending U.S. Appl. No. 16/598,012.
U.S. Appl. No. 16/598,012, filed Oct. 10, 2019, Chuong Luu.
U.S. Office action received in copending U.S. Appl. No. 17/587,402 dated Apr. 21, 2023.

* cited by examiner

SEMICONDUCTOR DEVICES

CROSS-REFERENCE TO RELATED APPLICATIONS

This is a continuation application based on pending U.S. application Ser. No. 16/708,717, filed on Dec. 10, 2019, the entire contents of which is hereby incorporated by reference.

Korean Patent Application No. 10-2019-0002425 filed on Jan. 8, 2019, Korean Patent Application No. 10-2019-0009967 filed on Jan. 25, 2019, and Korean Patent Application No. 10-2019-0068893 filed on Jun. 11, 2019, in the Korean Intellectual Property Office, and entitled: "Semiconductor Devices," are incorporated by reference herein in their entirety.

BACKGROUND

1. Field

Example embodiments relate to a semiconductor device.

2. Description of the Related Art

With increasing demand for high performance, high speed, multifunctionality, and the like, of a semiconductor device, integration density of a semiconductor device has been increased. To meet the demand for high integration density of a semiconductor device, a semiconductor device having fine patterns has been developed, and it has become important to implement patterns having fine widths or fine spacing distances therebetween. Also, to overcome limitations in operational properties for a reduced size of a planar metal oxide semiconductor FET (MOSFET), the development of a semiconductor device including a FinFET having a three-dimensional channel has been undertaken.

SUMMARY

Embodiments are directed a semiconductor device, including an active region extending in a first direction on a substrate, a plurality of channel layers on the active region and spaced apart from each other vertically, a gate structure intersecting the active region and the plurality of channel layers, the gate structure extending in a second direction on the substrate and surrounding the plurality of channel layers, and a source/drain region on the active region at at least one side of the gate structure, the source/drain region being in contact with the plurality of channel layers, the source/drain region including first epitaxial layers having a first composition and including first layers on side surfaces of the plurality of channel layers taken in the first direction and a second layer on the active region at a lower end of the source/drain region, and a second epitaxial layer having a second composition different from the first composition, the second epitaxial layer being interposed between the first epitaxial layers in the first direction and being interposed between the first epitaxial layers vertically in a third direction, wherein the third direction is perpendicular to the first direction and the second direction.

Embodiments are also directed to a semiconductor device, including an active region, a plurality of channel layers on the active region and spaced apart from each other vertically, a gate structure surrounding side surfaces taken in a first direction, upper surfaces, and lower surfaces of the plurality of channel layers, and a source/drain region on the active region at at least one side of the gate structure, the source/drain region being in contact with the plurality of channel layers, the source/drain region including at least one first epitaxial layer having a first composition, and covering side surfaces of the plurality of channel layers taken in a second direction and covering at least a portion of an upper surface of the active region at a lower end of the source/drain region, and a second epitaxial layer having a second composition different from the first composition, the second epitaxial layer being layered on the first epitaxial layer, and extending more upwardly than an uppermost surface of the plurality of channel layers.

Embodiments are also directed to a semiconductor device, including an active region extending in a first direction on a substrate, a plurality of channel layers on the active region and spaced apart from each other vertically, a gate structure intersecting the active region and the plurality of channel layers, the gate structure extending in a second direction on the substrate and surrounding the plurality of channel layers, internal spacer layers at opposite sides of the gate structure taken in the first direction, the internal spacer layers being disposed in a lower portion of each of the plurality of channel layers, and a source/drain region on the active region at at least one side of the gate structure, the source/drain region being contact with the plurality of channel layers and including a plurality of epitaxial layers, and having concentration gradients of impurities corresponding to a vertical arrangement of the internal spacer layers and the plurality of channel layers in a third direction, wherein the third direction is perpendicular to the first and second directions.

BRIEF DESCRIPTION OF THE DRAWINGS

Features will become apparent to those of skill in the art by describing in detail example embodiments with reference to the attached drawings in which.

DETAILED DESCRIPTION

Hereinafter, embodiments will be described as follows with reference to the accompanying drawings.

Figure 1:
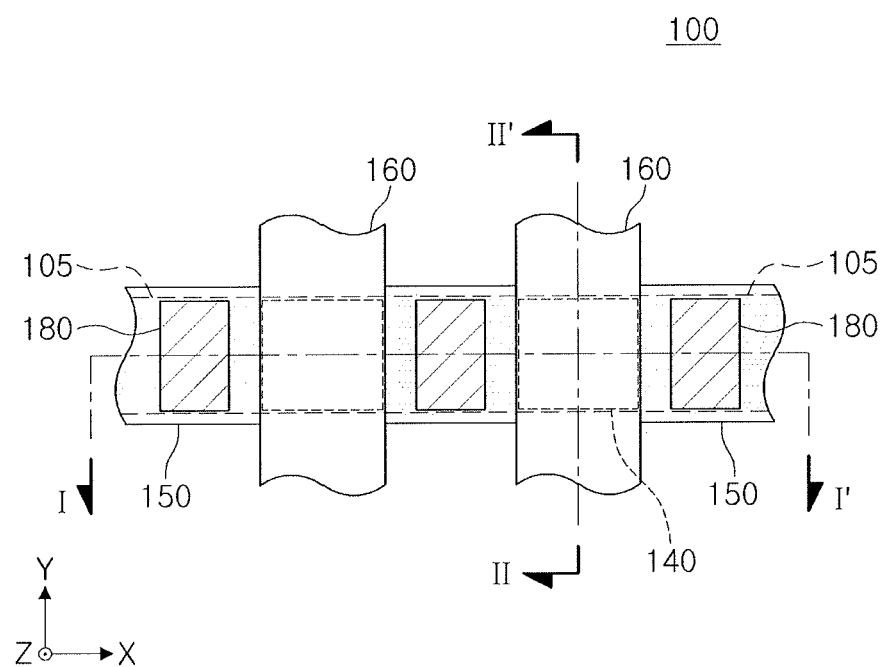
FIG. 1 illustrates a plan diagram of a semiconductor device according to an example embodiment.
Figure 2:
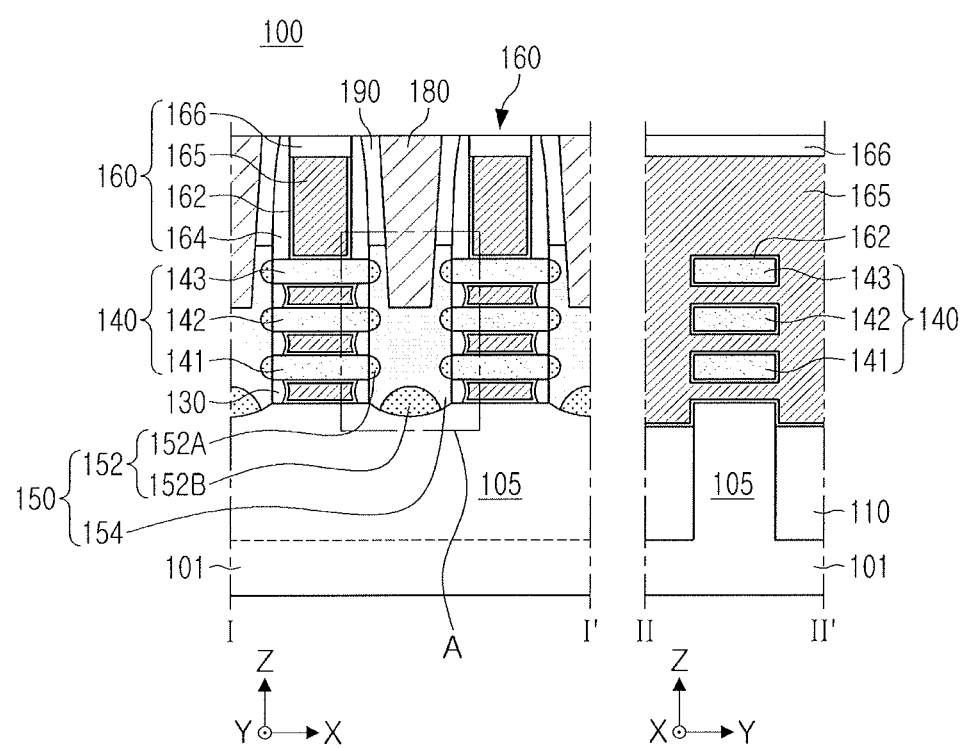
FIG. 2 illustrates a cross-sectional diagram of a semiconductor device according to an example embodiment.

FIG. 1 is a plan diagram illustrating a semiconductor device according to an example embodiment. FIG. 2 illustrates cross-sectional surfaces of the semiconductor device illustrated in FIG. 1 taken along lines I-I' and II-II'. For ease of description, only main elements of the semiconductor device are illustrated in FIGS. 1 and 2.

Referring to FIGS. 1 and 2, a semiconductor device 100 may include a substrate 101, an active region 105 on the substrate 101, channel structures 140 including a plurality of channel layers 141, 142, and 143 on the active region 105 and spaced apart from each other vertically, source/drain regions 150 in contact with the plurality of channel layers 141, 142, and 143, gate structures 160 intersecting the active region 105 and extending, and contact plugs 180 connected to the source/drain regions 150. The semiconductor device 100 may further include device isolating layers 110, internal spacer layers 130, and interlayer insulating layers 190. The gate structure 160 may include a gate dielectric layer 162, a gate electrode 165, spacer layers 164, and a gate capping layer 166.

In the semiconductor device 100, the active region 105 may have a fin structure, and the gate electrode 165 may be disposed between the active region 105 and the channel structure 140, among the plurality of channel layers 141, 142, and 143 of the channel structure 140, and in an upper portion of the channel structure 140. Accordingly, the semiconductor device 100 may include a gate-all-around type field effect transistor (FET) formed by the channel structures 140, the source/drain regions 150, and the gate structures 160. The transistor may be, for example, an NMOS transistor.

The substrate 101 may have an upper surface extending in an x direction and a y direction. The substrate 101 may include a semiconductor material, such as a IV group semiconductor, a III-V group compound semiconductor, or a II-VI group compound semiconductor. For example, the IV group semiconductor may include silicon, germanium, or silicon-germanium. The substrate 101 may be provided as, for example, a bulk wafer, an epitaxial layer, a silicon-on-insulator (SOI) layer, a semiconductor-on-insulator (SeOI) layer, or the like.

The device isolating layers 110 may define the active region 105 on the substrate 101. The device isolating layers 110 may be formed through a shallow trench isolation (STI) process, for example. In an example embodiment, the device isolating layer 110 may further include a region having stepped portions and extending towards a lower portion of the substrate 101. The device isolating layer 110 may partially expose an upper portion of the active region 105. In an example embodiment, the device isolating layers 110 may have a curved upper surface, a level of which may increase towards the active region 105. The device isolating layers 110 may be formed of an insulating material. The device isolating layer 110 may be an oxide, a nitride, or a combination thereof, for example.

The active region 105 may be defined by the device isolating layer 110 and may extend in a first direction, for example, the x direction, in the substrate 101. The active region 105 may be configured to protrude from the substrate 101. An upper end of the active region 105 may be configured to protrude from an upper surface of the device isolating layer 110 to a certain height. The active region 105 may be a portion of the substrate 101, or may include an epitaxial layer grown from the substrate 101. In both side regions of the gate structures 160, a portion of the active region 105 on the substrate 101 may be recessed, and the source/drain regions 150 may be disposed in the recessed active region 105. The active region 105 may include impurities (for example, dopants), or may include doping regions including impurities.

The channel structure 140 may include two or more channel layers (for example, the first to third channel layers 141, 142, and 143) spaced apart from each other vertically in a direction perpendicular to an upper surface of the active region 105 (for example, the z direction) on the active region 105. The first to third channel layers 141, 142, and 143 may be connected to the source/drain region 150, and may be spaced apart from an upper surface of the active region 105. The first to third channel layers 141, 142, and 143 may have a width the same as or similar to a width of the active region 105 in the y direction, and may have a width the same as or similar to a width of the gate structure 160 in the x direction. In an example embodiment, the first to third channel layers 141, 142, and 143 may also have a reduced width such that side surfaces of the first to third channel layers 141, 142, and 143 may be disposed in a lower portion of the gate structure 160 in the x direction.

The first to third channel layers 141, 142, and 143 may be formed of a semiconductor material. For example, the first to third channel layers 141, 142, and 143 may include at least one of silicon (Si), germanium (SiGe), and silicon-germanium (Ge). The first to third channel layers 141, 142, and 143 may be formed of a material that is the same as a material of the substrate 101, for example. In example embodiment, the first to third channel layers 141, 142, and 143 may include an impurity region disposed in a region adjacent to the source/drain region 150. The numbers and shapes of the channel layers 141, 142, and 143 included in a single channel structure 140 may be varied in example embodiments. For example, in an example embodiment, the channel structure 140 may further include a channel layer on an upper surface of the active region 105.

The source/drain regions 150 may be on the active region 105 on both side regions of the channel structure 140. The source/drain region 150 may include first epitaxial layers 152 on each of side surfaces of the first to third channel layers 141, 142, and 143 of the channel structure 140 and on the active region 105 in a lower end of the source/drain region 150. The source/drain region may further include a second epitaxial layer 154 filling spaces between the first epitaxial layers 152. The first epitaxial layers 152 and the second epitaxial layer 154 may be semiconductor layers including silicon (Si), and may include different types and/or different concentrations of impurities from each other.

The first epitaxial layers 152 may include first layers 152A on side surfaces of the first to third channel layers 141, 142, and 143 and second layers 152B on an upper surface of the active region 105. The first layers 152A may be on both side surfaces of the channel structure 140 in the x direction. With the first layers 152A are on both side surfaces of the channel structure 140, a short channel effect caused by diffusion of impurities included in the second epitaxial layer 154 may be reduced or prevented. The first layers 152A may be separated from each other among the first to third channel layers 141, 142, and 143 disposed perpendicularly in the z direction. The first layers 152A may be separated from the second layer 152B as well. Also, the first layers 152A may protrude towards the second epitaxial layer 154 from coplanar side surfaces formed by the internal spacer layers 130 and the first to third channel layers 141, 142, and 143. Accordingly, the second epitaxial layer 154 may be interposed between the first layers 152A spaced apart from each other in the z direction. The second epitaxial layer 154 may also be interposed between the first layers 152A spaced apart from each other in a single source/drain region 150 in the x direction. At least a portion of the first epitaxial layers 152 may overlap the second epitaxial layer 154 and may be configured to not overlap the internal spacer layers 130, on a plane.

The second layer 152B may be on at least a portion of an upper surface of the active region 105 in a lower portion. For example, the second layer 152B may be disposed in a central region taken in the x direction, for example. The second layer 152B may have a maximum thickness greater than thicknesses of the first layers 152A. A width of an upper portion of the second layer 152B may be less than a width of a lower portion of the second layer 152B, and the second layer 152B may have an upwardly curved shape. A shape of a lower surface of the source/drain region 150 may be varied in example embodiments. For example, the lower surface of the source/drain region 150 may be curved in different depth, or may have a planar shape. Accordingly, a shape of the second layer 152B may also be varied in example embodiments.

The first epitaxial layer 152 may be a region including a higher concentration of impurities than a concentration of impurities included in the active region 105. The first epitaxial layers 152 may be epitaxially grown from the first to third channel layers 141, 142, and 143 and the active region 105. For example, the first epitaxial layer 152 may include n-type impurities such as arsenic (As) and/or phosphorus (P). The first epitaxial layer 152 may be, for example, a SiAs layer, a SiP layer, a SiPC layer, a SiC layer, a SiPAs layer, or a SiGeP layer. A concentration of impurities included in the first epitaxial layer 152 may be within a range of approximately $2 \times 10^{20}/cm^3$ to $8 \times 10^{20}/cm^3$. A thickness of each of the first layers 152A may be within a range of approximately 4 nm to 8 nm, and the second layer 152B may have a thickness greater than the thicknesses of the first layers 152A, for example.

The second epitaxial layer 154 may be configured to fill a region between adjacent channel structures 140. The second epitaxial layer 154 may surround a surface of the first epitaxial layer 152 on which the first epitaxial layer 152 is not in contact with the channel structure 140 or the active region 105. The second epitaxial layer 154 may cover side surfaces of the internal spacer layers 130. The second epitaxial layer 154 may be configured to fill a space between the first layers 152A of the first epitaxial layers 152 spaced apart from each other upwardly and downwardly. Accordingly, at least a portion of the second epitaxial layer 154 may overlap each of the first layers 152A and the second layer 152B of the first epitaxial layer 152 on a plane. The second epitaxial layer 154 may extend more upwardly than an uppermost surface of the channel structure 140.

The second epitaxial layer 154 may have a composition different from a composition of the first epitaxial layers 152. For example, the second epitaxial layer 154 may be a region including a higher concentration of impurities than a concentration of impurities included in the first epitaxial layer 152. The second epitaxial layer 154 may be epitaxially grown from the first epitaxial layers 152. The impurities may be the same as or different from the impurities included in the first epitaxial layer 152. For example, the first epitaxial layer 152 may include first impurities of a first conductivity type in a first concentration, and the second epitaxial layer 154 may include first or second impurities of the same first conductivity type in a second concentration higher than the first concentration. The second concentration may be within a range of 10 times to 20 times the first concentration. A concentration of impurities included in the second epitaxial layer 154 may be within a range of approximately $3.1 \times 10^{21}/cm^3$ to $3.9 \times 10^{21}/cm^3$. For example, the second epitaxial layer 154 may be a SiP layer including phosphorus (P). In an example embedment, the first epitaxial layer 152 may be a SiP or SiAs epitaxial layer, and the second epitaxial layer 154 may be a SiP epitaxial layer.

The impurities of the second epitaxial layer 154 may be partially diffused into an adjacent first epitaxial layer 152, and the impurities may be partially included in the first epitaxial layer 152 in a lower concentration than in the second epitaxial layer 154. Also, the impurities of the first epitaxial layer 152 may be partially diffused into an adjacent second epitaxial layer 154, and the impurities may be partially included in the second epitaxial layer 154 in a lower concentration than in the first epitaxial layer 152. The first epitaxial layer 152 and the second epitaxial layer 154 may be formed as epitaxial layers. Thus, damage to a film caused by an ion implantation process when the first epitaxial layer 152 and the second epitaxial layer 154 are formed as doping regions may be avoided, which may help improve electrical properties of the semiconductor device 100.

The gate structure 160 may intersect the active region 105 and the channel structure 140, and may extend in one direction (for example, a y direction) in the active region 105 and upper portions of the channel structures 140. Channel regions of transistors may be formed in the active region 105 and the channel structure 140 intersecting the gate structure 160. The gate structure 160 may include a gate electrode 165, a gate dielectric layer 162 disposed between the gate electrode 165 and the first to third channel layers 141, 142, and 143, gate spacer layers 164 on side surfaces of the gate electrode 165, and a gate capping layer 166 on an upper surface of the gate electrode 165.

The gate dielectric layer 162 may be disposed between the active region 105 and the gate electrode 165, and between the channel structure 140 and the gate electrode 165. The gate dielectric layer 162 may be configured to cover at least portions of surfaces of the gate electrode 165. For example, the gate dielectric layer 162 may surround overall surfaces of the gate electrode 165 other than an uppermost surface. The gate dielectric layer 162 may extend to a space between the gate electrode 165 and the spacer layers 164, for example. The gate dielectric layer 162 may include an oxide, a nitride, or a high-k material, for example. The high-k material may refer to a dielectric material having a dielectric constant higher than a dielectric constant of a silicon oxide ($SiO_2$) film. The high-k material may be one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$), for example.

The gate electrode 165 may fill a space between the first to third channel layers 141, 142, and 143 in an upper portion of the active region 105 and may extend to an upper portion of the channel structure 140. The gate electrode 165 may be spaced apart from the plurality of channel layers 141, 142, and 143 by the gate dielectric layer 162. The gate electrode 165 may include a conductive material. For example, the gate electrode 165 may include a metal nitride material such as a titanium nitride film (TiN), a tantalum nitride film (TaN), or a tungsten nitride film (WN), and/or a metal material such as aluminum (Al), tungsten (W), molybdenum (Mo), or the like, or a semiconductor material such as a doped polysilicon. The gate electrode 165 may include multiple layers, for example, two or more layers. The gate electrodes 165 may be separated from each other by a separating portion between at least portions of adjacent transistors, depending on a configuration of the semiconductor device 100.

The gate spacer layers 164 may be on both side surfaces of the gate electrode 165. The gate spacer layers 164 may insulate the source/drain regions 150 from the gate electrode 165. In an example embodiment, the gate spacer layers 164 may have a multilayer structure. The gate spacer layers 164 may be formed of an oxide, a nitride, or an oxynitride, for example, and may be formed of a low-k material film.

The gate capping layer 166 may be disposed at an upper portion of the gate electrode 165, and each of a lower surface and side surfaces of the gate capping layer 166 may be surrounded by the gate electrode 165 and the gate spacer layers 164.

The internal spacer layers 130 may be disposed side by side with the gate electrode 165 between the channel structures 140. The gate electrode 165 may be spaced apart from and electrically isolated from the source/drain regions 150 by the internal spacer layers 130 in a lower portion of the third channel layer 143. Side surfaces of the internal spacer layers 130 facing the gate electrode 165 may be recessed and curved towards the gate electrode 165, for example. The internal spacer layers 130 may be formed of an oxide, a nitride, or oxynitride, for example, and may be formed of a low-k material film.

The contact plug 180 may penetrate the interlayer insulating layer 190 and may be connected to the source/drain region 150. The contact plug 180 may apply an electrical signal to the source/drain region 150. The contact plug 180 may be on the source/drain region 150 as illustrated in FIG. 1, and may have a length longer than a length of the source/drain region 150 in the y direction. The contact plug 180 may have a sloped side surface in which a width of a lower portion is less than a width of an upper portion in accordance with an aspect ratio, for example. The contact plug 180 may extend further downwardly than the third channel layer 143 from an upper portion, for example. In an example embodiment, the contact plugs 180 may be recessed by a height corresponding to an upper surface of the second channel layer 142, for example. In an example embodiment, the contact plug 180 may not be recessed into the source/drain region 150 and may be configured to be in contact with and disposed along an upper surface of the source/drain region 150. The contact plug 180 may include, for example, a metal nitride material such as a titanium nitride film (TiN), a tantalum nitride film (TaN), or a tungsten nitride film (WN), and/or a metal material such as aluminum (Al), tungsten (W), molybdenum (Mo), or the like.

The interlayer insulating layer 190 may cover the source/drain regions 150 and the gate structures 160, and may be configured to cover the device isolating layer 110 in a region not illustrated in the diagram. The interlayer insulating layer 190 may include an oxide, a nitride, or an oxynitride, for example, and may include a low-k material.

Figure 3:
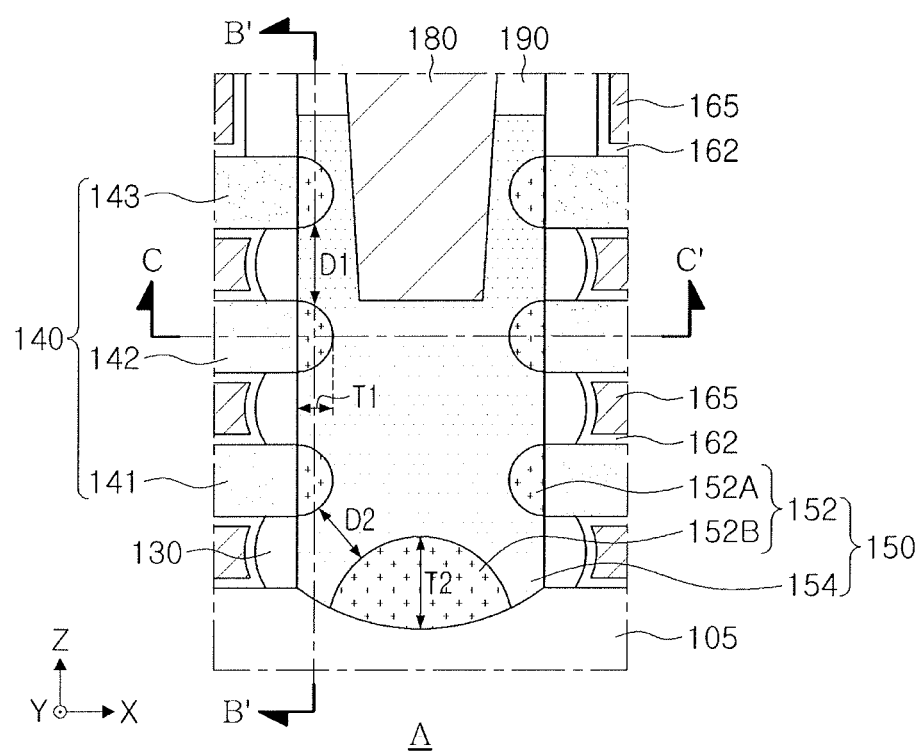
FIG. 3 illustrates an enlarged diagram of a portion of a semiconductor device according to an example embodiment.

FIG. 3 is a diagram illustrating an enlarged region A of a semiconductor device according to an example embodiment illustrated in FIG. 2.

Referring to FIG. 3, first layers 152A of first epitaxial layers 152 may be on side surfaces of first to third channel layers 141, 142, and 143, respectively, and may be spaced vertically apart from each other by a first spacing distance D1 in the z direction. The first layers 152A may be spaced apart from a second layer 152B on an active region 105 by a second spacing distance D2, a shortest distance. The first spacing distance D1 may be different from the second spacing distance D2.

Portions of the first layers 152A may extend onto side surfaces of internal spacer layers 130. In another implementation, the first layers 152A may be configured to be only on side surfaces of the first to third channel layers 141, 142, and 143. Each of the first layers 152A may have a first maximum thickness T1 from side surfaces of the first to third channel layers 141, 142, and 143, and the second layer 152B may have a second maximum thickness T2 from an upper surface of the active region 105. The second maximum thickness T2 may be greater than the first maximum thickness T1, for example.

Figure 4A:
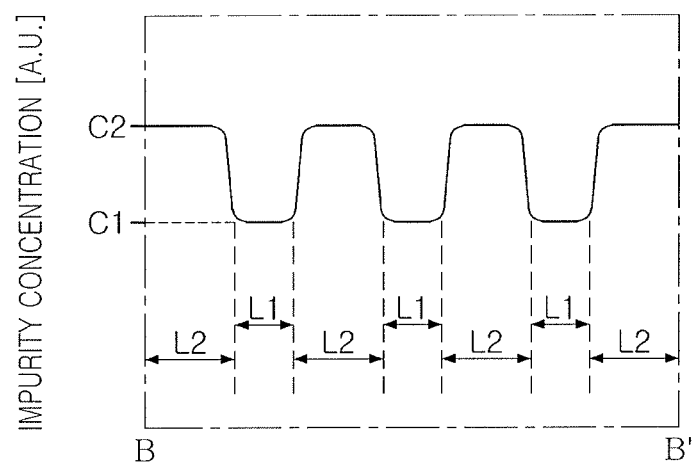
FIGS. 4A to 5B illustrate diagrams of a distribution of a concentration of impurities included in a source/drain region in a semiconductor device according to an example embodiment.
Figure 4B:
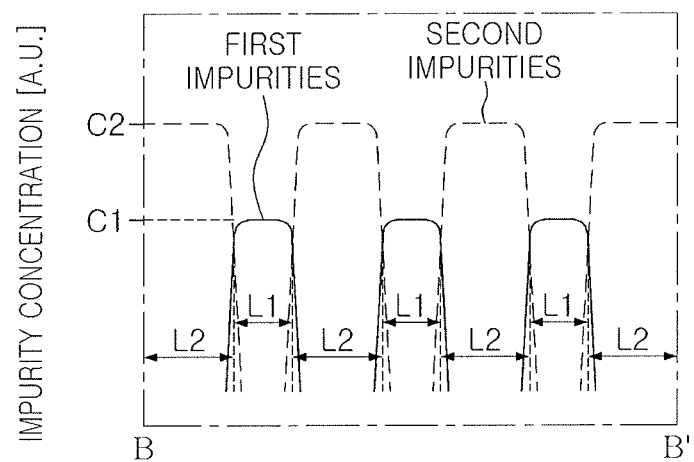

FIGS. 4A and 4B illustrate a distribution profile of concentration of impurities included in the source/drain region 150 taken along B-B' illustrated in FIG. 3. FIG. 4A illustrates a profile of when the first epitaxial layers 152 and the second epitaxial layer 154 include the same impurities, and FIG. 4B illustrates a profile of when the first epitaxial layer 152 includes first impurities, and the second epitaxial layer 154 includes second impurities different from the first impurities.

In FIGS. 4A and 4B, a first section L1 may be a region corresponding to the first epitaxial layers 152 of the source/drain region 150, and a second section L2 may be a region corresponding to the second epitaxial layer 154. Also, the first section L1 may be a region corresponding to at least portions of external regions of the first to third channel layers 141, 142, and 143, and the second section L2 may include a region corresponding to external regions of the internal spacer layers 130.

As illustrated in FIG. 4A, the first epitaxial layer 152 may include impurities in a first concentration C1, and the second epitaxial layer 154 may include impurities in a second concentration C2 higher than the first concentration C1. The first and second concentrations C1 and C2 may be maximum concentrations of the first and second sections L1 and L2. The second concentration C2 may be within a range of approximately 10 times to 20 times the first concentration C1, for example. As described above, the source/drain region 150 may have concentration gradients corresponding to the internal spacer layers 130 and the first to third channel layers 141, 142, and 143 in external regions of the internal spacer layers 130 and the first to third channel layers 141, 142, and 143 in the z direction. Also, as the profiles having different concentrations alternately appear, the first and second sections L1 and L2 may appear to be distinguished from each other.

In an example embodiment, changes in concentration of impurities on a boundary between the first and second sections L1 and L2 may be steeper or gentler than in the example illustrated in the diagrams. Also, a section in which a concentration of impurities is constant or uniform may appear in each of the sections L1 and L2. However, in example embodiments, a peak of a concentration of impurities may appear in each of the sections L1 and L2. In another implementation, a maximum concentration of impurities in the second layer 152B may be the first concentration C1.

As in the example illustrated in FIG. 4B, even when the first epitaxial layers 152 and the second epitaxial layer 154 include different impurities, profiles having different concentrations may alternately appear in the first and second sections L1 and L2. The first epitaxial layer 152 may further include second impurities in at least a region adjacent to the second epitaxial layer 154, and the second epitaxial layer 154 may further include the first impurities in a region adjacent to the first epitaxial layers 152.

Figure 5A:
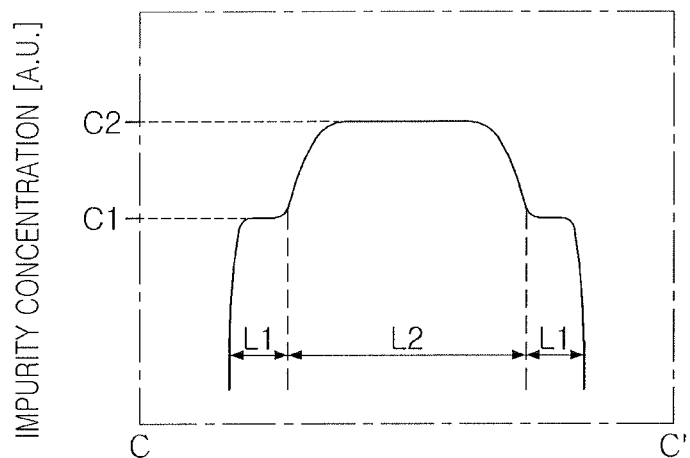
Figure 5B:
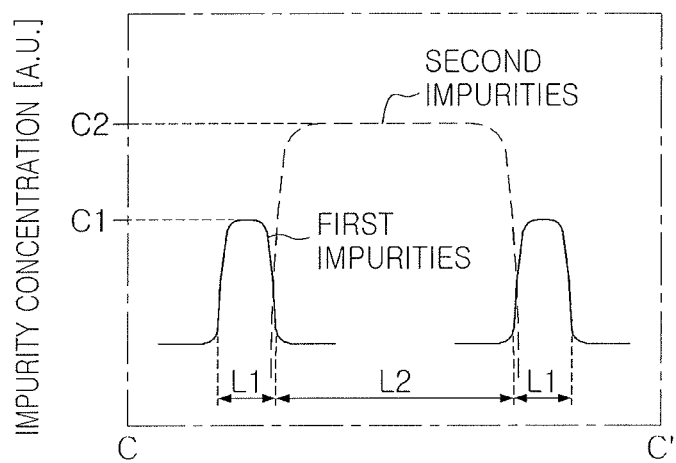

FIGS. 5A and 5B illustrate profiles of impurities included in the source/drain region 150 taken along C-C' illustrated in FIG. 3. FIG. 5A illustrates a profile of when the first epitaxial layers 152 and the second epitaxial layer 154 include the same impurities, and FIG. 5B illustrates a profile of when the first epitaxial layer 152 includes first impurities, and the second epitaxial layer 154 includes second impurities different from the first impurities.

In FIGS. 5A and 5B, a first section L1 may be a region corresponding to the first epitaxial layers 152 of the source/drain region 150, and a second section L2 may be a region corresponding to the second epitaxial layer 154.

As illustrated in FIG. 5A, the source/drain region 150 may include impurities in a second concentration C2 in the second epitaxial layer 154 including a center taken in the x direction, and the first epitaxial layers 152 on both ends may include impurities in a first concentration C1 lower than the second concentration C2. The source/drain region 150 may have a section in which a concentration of impurities is substantially constant or uniform in a central region including the center, the region of the second epitaxial layer 154. In an example embodiment, changes in concentration of impurities on a boundary between the first and second sections L1 and L2 may be steeper or gentler than in the example illustrated in the diagram.

As illustrated in FIG. 5B, even when the first epitaxial layers 152 and the second epitaxial layer 154 include different impurities, profiles having different concentrations (for example, different maximum concentrations) may appear in a corresponding manner in the first and second sections L1 and L2. The first epitaxial layers 152 may further include second impurities in at least a region adjacent to the second epitaxial layer 154, and the second epitaxial layer 154 may further include the first impurities in a region adjacent to the first epitaxial layers 152.

Figure 6:
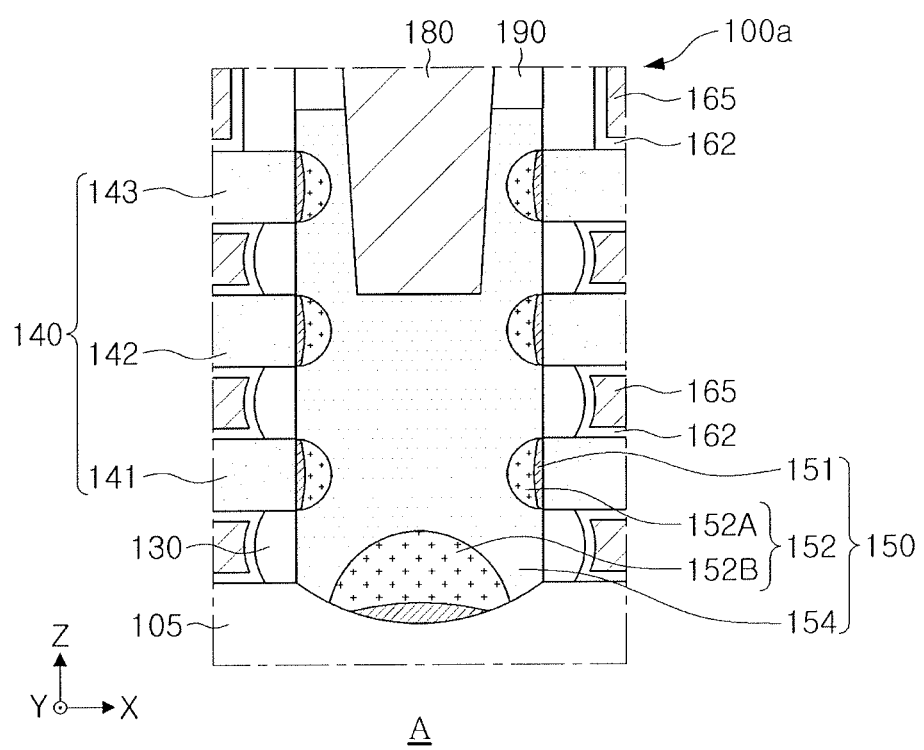
FIG. 6 illustrates an enlarged diagram of a portion of a semiconductor device according to an example embodiment.

FIG. 6 is a diagram illustrating an enlarged portion of a semiconductor device according to an example embodiment. FIG. 6 illustrates a region corresponding to region A illustrated in FIG. 2.

Referring to FIG. 6, in a semiconductor device 100a, a source/drain region 150a may include first epitaxial layers 152 and second epitaxial layers 154 filling a space between the first epitaxial layers 152, and may further include third epitaxial layers 151 configured to be in contact with the first epitaxial layers 152.

The third epitaxial layers 151 may be on side surfaces of the first to third channel layers 141, 142, and 143, respectively, and may be on at least a portion of an upper surface of the active region 105 at a lower end of the source/drain region 150. The third epitaxial layers 151 may be a layer configured to facilitate a growth of the first epitaxial layers 152 or to reduce a lattice mismatch of the first epitaxial layers 152. The third epitaxial layers 151 may be a SiAs layer, a SiP layer, a SiPC layer, a SiC layer, a SiPAs layer, or a SiGeP layer, for example. The third epitaxial layers 151 may include impurities in a concentration lower than a concentration of impurities included in the first epitaxial layers 152 or may not include impurities. In an example embodiment, the third epitaxial layers 151 may be only on portions of side surfaces of the first to third channel layers 141, 142, and 143. In an example embodiment, a size of a region in which the third epitaxial layer 151 is in contact with an upper surface of the active region 105 may be varied.

Figure 7:
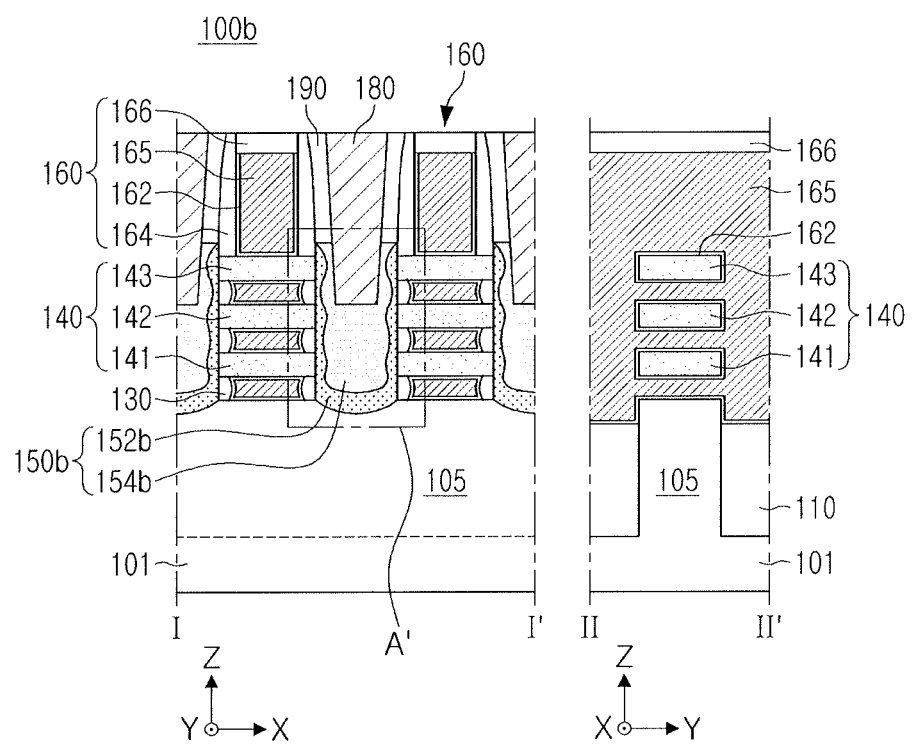
FIG. 7 illustrates a cross-sectional diagram of a semiconductor device according to an example embodiment.
Figure 8:
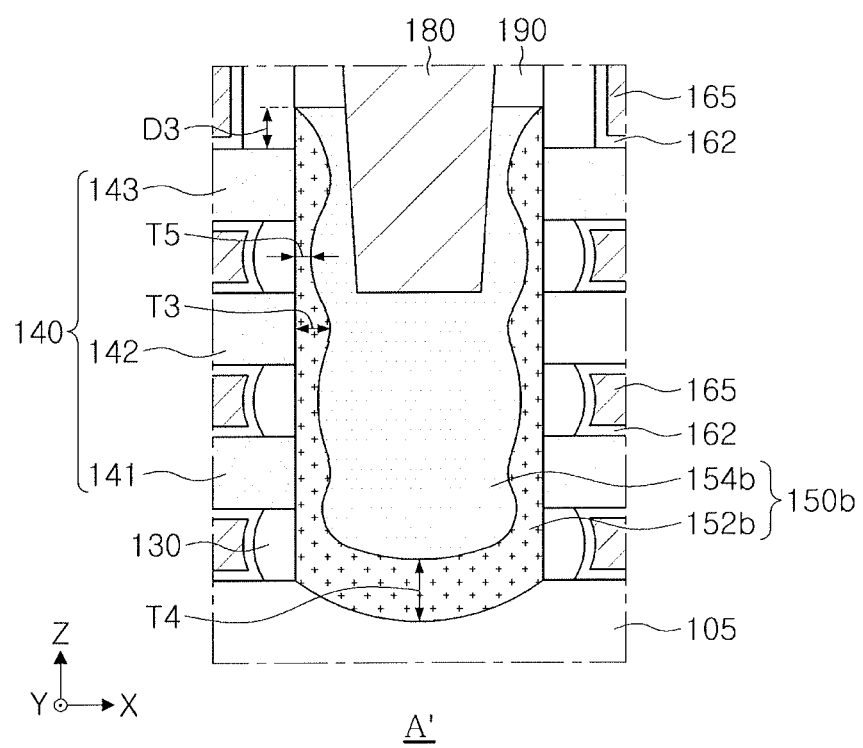
FIG. 8 illustrates an enlarged diagram of a portion of a semiconductor device according to an example embodiment.

FIG. 7 is a cross-sectional diagram illustrating a semiconductor device according to an example embodiment. FIG. 7 illustrates regions corresponding to cross-sectional surfaces taken along lines I-I' and II-II' in FIG. 1. FIG. 8 is a diagram illustrating an enlarged portion of a semiconductor device according to an example embodiment. FIG. 8 illustrates region A' illustrated in FIG. 7 in magnified form.

Referring to FIGS. 7 and 8, in a source/drain region 150b in a semiconductor device 100b, a first epitaxial layer 152b may be disposed as a single layer extending along side surfaces of first to third channel layers 141, 142, and 143 of a channel structure 140 and side surfaces of internal spacer layers 130 and forming a lower surface of the source/drain region 150b at a lower end. Accordingly, the first epitaxial layer 152b may be configured to completely surround a lower surface and side surfaces of a second epitaxial layer 154b in the x direction. Thus, the second epitaxial layer 154b may not be directly in contact with the active region 105.

The first epitaxial layer 152b may be in contact with gate spacer layers 164 at an upper end of the first epitaxial layer 152b. A length D3 of the first epitaxial layer 152b in contact with the gate spacer layers 164 may be varied in example embodiments or, in another implementation, the first epitaxial layer 152b may not be in contact with the gate spacer layers 164.

In an example embodiment, a thickness of the first epitaxial layer 152b may not be uniform. The first epitaxial layer 152b may have a third maximum thickness T3 on side walls of the first to third channel layers 141, 142, and 143, and may have a fourth maximum thickness T4 greater than the third maximum thickness T3 at a lower portion. In an example embodiment, the fourth maximum thickness T4 may be two or more times the third maximum thickness T3. The first epitaxial layer 152b may have a fifth maximum thickness T5 less than the third maximum thickness T3 on side walls of the internal spacer layers 130, and may have flexures formed by the thicknesses. The structure of the first epitaxial layer 152b may be controlled in accordance with a growth direction, a growth thickness, and the like. A depth of the downward flexure of a lower surface of the source/drain region 150b may be varied in example embodiments, and accordingly, a shape of the first epitaxial layer 152b may also be varied on a lower surface of the source/drain region 150.

Figure 9:
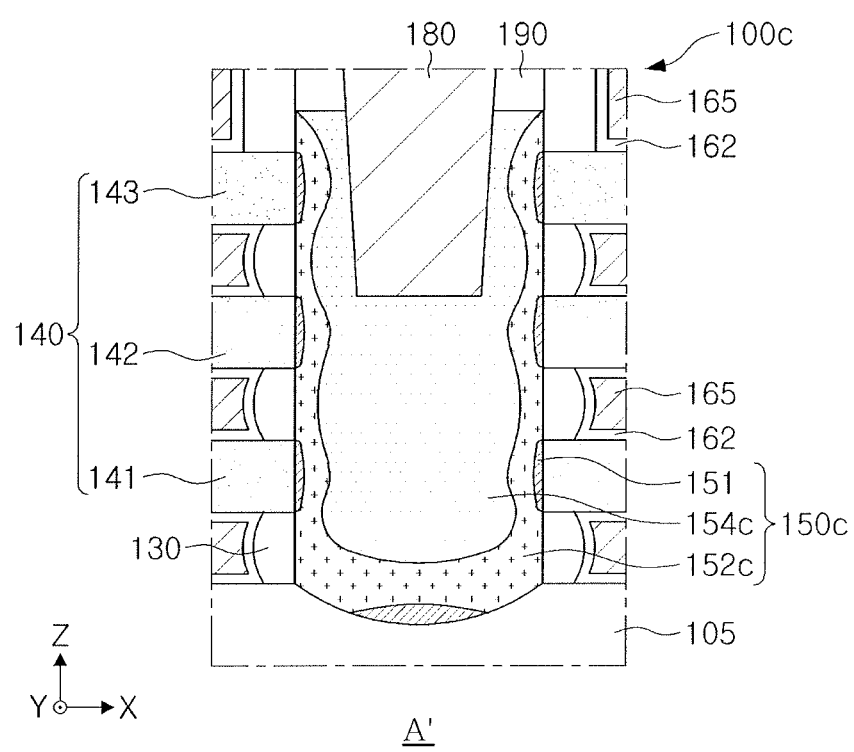
FIG. 9 illustrates an enlarged diagram of a portion of a semiconductor device according to an example embodiment.

FIG. 9 is an enlarged diagram illustrating a portion of a semiconductor device according to an example embodiment. FIG. 9 illustrates a region corresponding to region A' illustrated in FIG. 7.

Referring to FIG. 9, in a semiconductor device 100c, a source/drain region 150c may include a first epitaxial layer 152c. The source/drain region 150c may also include a second epitaxial layer 154c filling a space between the first epitaxial layers 152c, and may further include third epitaxial layers 151 in contact with the first epitaxial layers 152c and, for example, at a bottom of the first epitaxial layer 152c.

As described with reference to FIG. 6, the third epitaxial layers 151 may be on side surfaces of the first to third channel layers 141, 142, and 143, respectively, and may be on at least a portion of an upper surface of the active region 105 at a lower end of a source/drain regions 150c. The first epitaxial layer 152c may be disposed as a single layer covering a surface on which the third epitaxial layers 151 are not in contact with the first to third channel layers 141, 142, and 143. The second epitaxial layer 154c may be disposed as a single layer filling a space between the first epitaxial layers 152c.

Figure 10A:
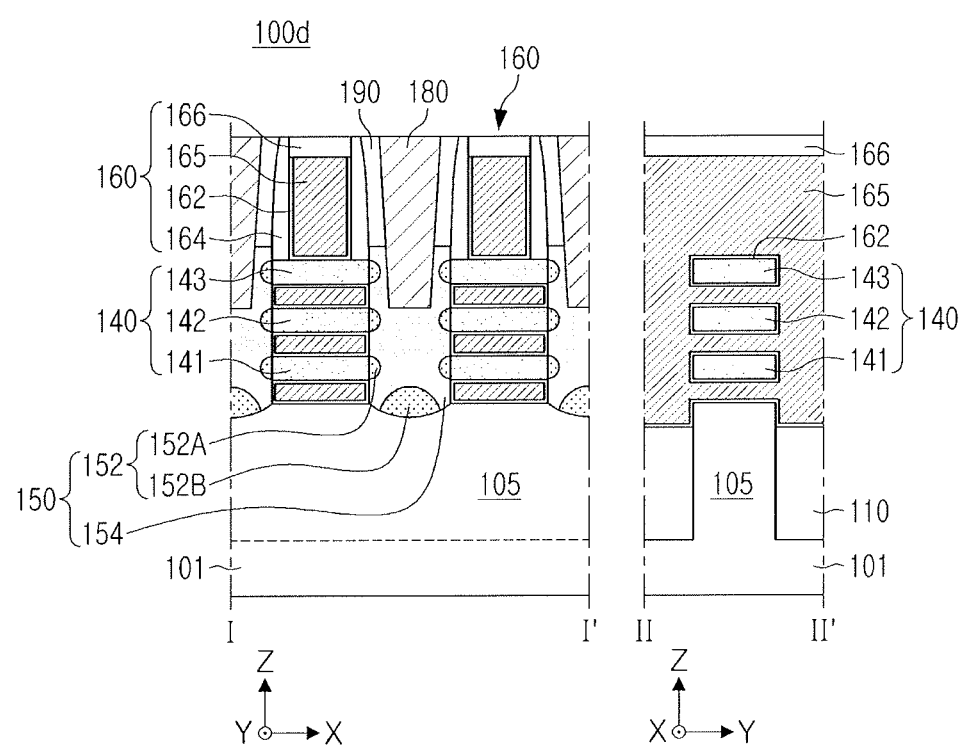
FIGS. 10A to 10C illustrate cross-sectional diagrams of semiconductor devices according to example embodiments.
Figure 10B:
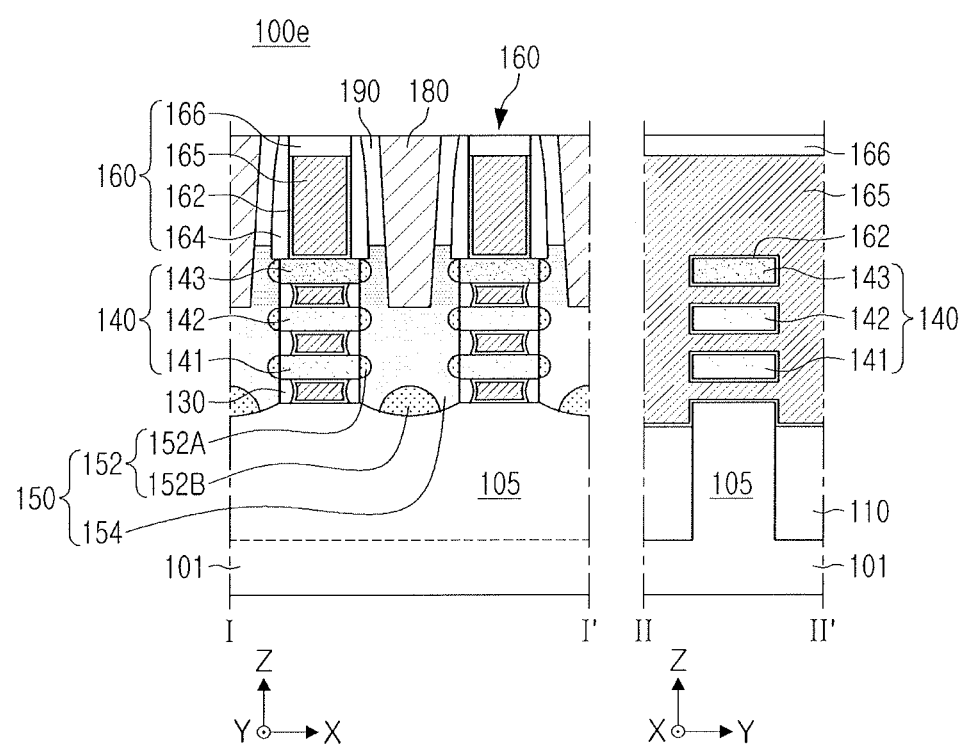
Figure 10C:
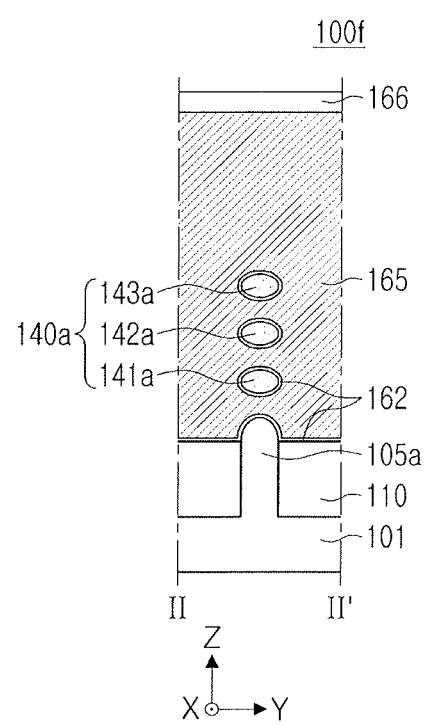

FIGS. 10A to 10C are cross-sectional diagrams illustrating semiconductor devices according to example embodiments. FIGS. 10A and 10B illustrate regions corresponding to cross-sectional surfaces taken long lines I-I' and II-II' in FIG. 1, and FIG. 10C illustrates a region corresponding to a cross-sectional surface taken along line II-II' in FIG. 1.

Referring to FIG. 10A, a semiconductor device 100d may not include an internal spacer layer 130 (differently from the example embodiment described with reference to FIG. 2). The gate electrode 165 may extend in the x direction among the first to third channel layers 141, 142, and 143 of the channel structure 140. Accordingly, both side surfaces of a gate electrode 165 taken in the x direction may be disposed side by side with both side surfaces of the channel structure 140 upwardly and downwardly, and may be coplanar with the both side surfaces of the channel structure 140.

Referring to FIG. 10B, in a semiconductor device 100e, both side surfaces of the channel structures 140 and the internal spacer layers 130 taken in the x direction may be disposed in a lower portion of the gate structures 160 (differently from the example embodiment described with reference to FIG. 2). Thus, the channel structure 140 may have a smaller width relative to a width of the gate structure 160. Accordingly, at least portions of first layers 152A of first epitaxial layers 152 may overlap the gate structures 160 on a plane. In FIG. 10B, both side surfaces of the channel structures 140 and the internal spacer layers 130 taken in the x direction may be disposed in lower portions of the gate spacer layers 164, for example. For example, in an example embodiment, the side surfaces may be disposed in a lower portion of the gate electrode 165.

Referring to FIG. 10C, in a semiconductor device 100f, widths of an active region 105a and a channel structure 140a may be different from the examples illustrated in FIG. 2. The active region 105a and the channel structure 140a may have relatively narrow widths, and accordingly, each of a plurality of channel layers 141a, 142a and 143a of the channel structure 140a may have a circular shape, an oval shape (in which a difference between lengths of a major axis and a minor axis is relatively small on a cross-sectional surface taken in the y direction), etc. For example, in the example embodiment illustrated in FIG. 2, each of the plurality of channel layers 141, 142, and 143 may have a width of approximately 20 nm to 50 nm in the y direction, and each of the plurality of channel layers 141a, 142a and 143a in the example embodiment may have a width of approximately 3 nm to 12 nm in the y direction. In example embodiments, widths of the active region 105a and the channel structure 140a and shapes of the active region 105a and the channel structure 140a formed along the widths may be varied.

FIGS. 11A to 11K are diagrams illustrating sequential processes of a method of manufacturing a semiconductor device according to an example embodiment. FIGS. 11A to 11K illustrate example embodiments of a method for manufacturing the semiconductor device illustrated in FIG. 6, and illustrate cross-sectional surfaces corresponding to that illustrated in FIG. 2.

Figure 11A:
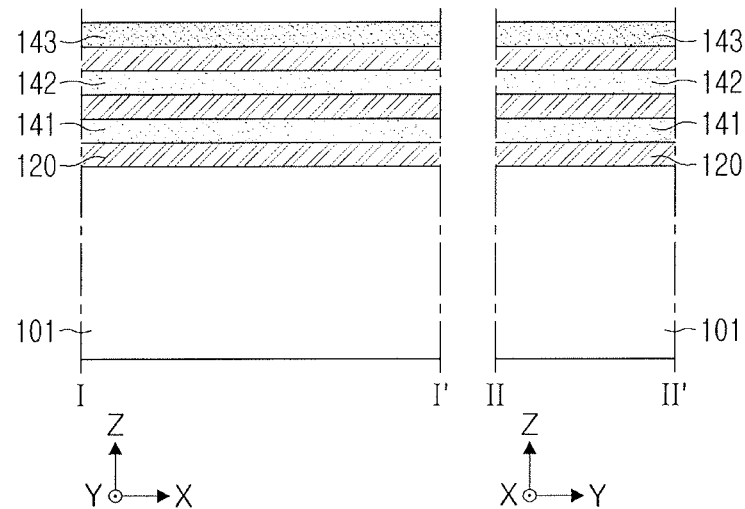
FIGS. 11A to 11K illustrate diagrams of processes of a method of manufacturing a semiconductor device in order according to an example embodiment.

Referring to FIG. 11A, sacrificial layers 120 may be alternately layered between respective ones of channel layers 141, 142, and 143 on a substrate 101 (the sacrificial layers 120 may be replaced with the gate dielectric layer 162 and the gate electrode 165 as illustrated in FIG. 2 through a subsequent process). The sacrificial layers 120 may be formed of a material having etch selectivity with respect to the plurality of channel layers 141, 142, and 143. The plurality of channel layers 141, 142, and 143 may include a material different from a material of the sacrificial layers 120. For example, the sacrificial layers 120 and the plurality of channel layers 141, 142, and 143 may include a semiconductor material including at least one of silicon (Si), germanium (SiGe), and silicon-germanium (Ge) and may include different materials, and the sacrificial layers 120 and the plurality of channel layers 141, 142, and 143 may or may not include impurities. For example, the sacrificial layers 120 may include silicon-germanium (Ge), and the plurality of channel layers 141, 142, and 143 may include silicon (Si).

The sacrificial layers 120 and the plurality of channel layers 141, 142, and 143 may be formed by performing an epitaxial growth process using the substrate 101 as a seed. Each of the sacrificial layers 120 and the plurality of channel layers 141, 142, and 143 may have a thickness of approximately 1 Å to 100 nm. The number of layers of the plurality of channel layers 141, 142, and 143 alternately layered with the sacrificial layers 120 may be varied in example embodiments.

Figure 11B:
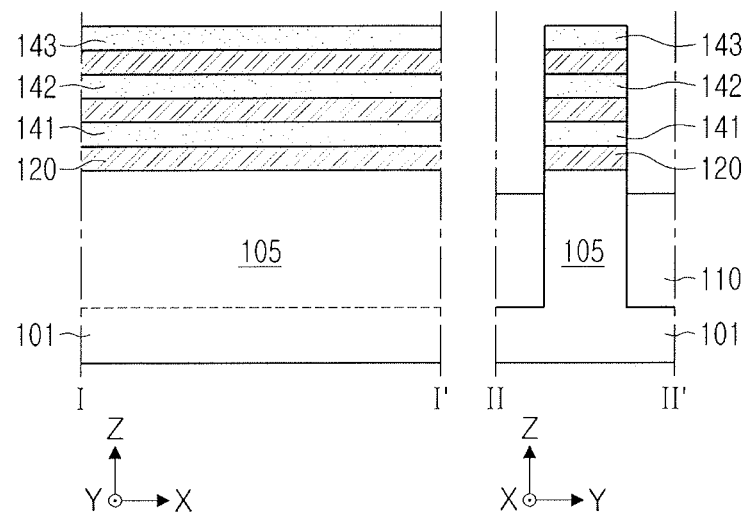

Referring to FIG. 11B, an active structure may be formed by removing a stack structure of the sacrificial layers 120 and the plurality of channel layers 141, 142, and 143 and a portion of the substrate 101. The active structure may include the sacrificial layers 120 and the plurality of channel layers 141, 142, and 143, alternately layered, and may further include an active region 105 configured to protrude from an upper surface of the substrate 101 by removing a portion of the substrate 101. The active structures may be configured to have a line form extending in one direction, the x direction, for example, and may be spaced apart from each other in the y direction.

In the region from which the portion of the substrate 101 is removed, device isolating layers 110 may be formed by filling the region with an insulating material and configuring the insulating material to be recessed to allow the active region 105 to protrude. Upper surfaces of the device isolating layers 110 may be formed to be positioned lower than an upper surface of the active region 105.

Figure 11C:
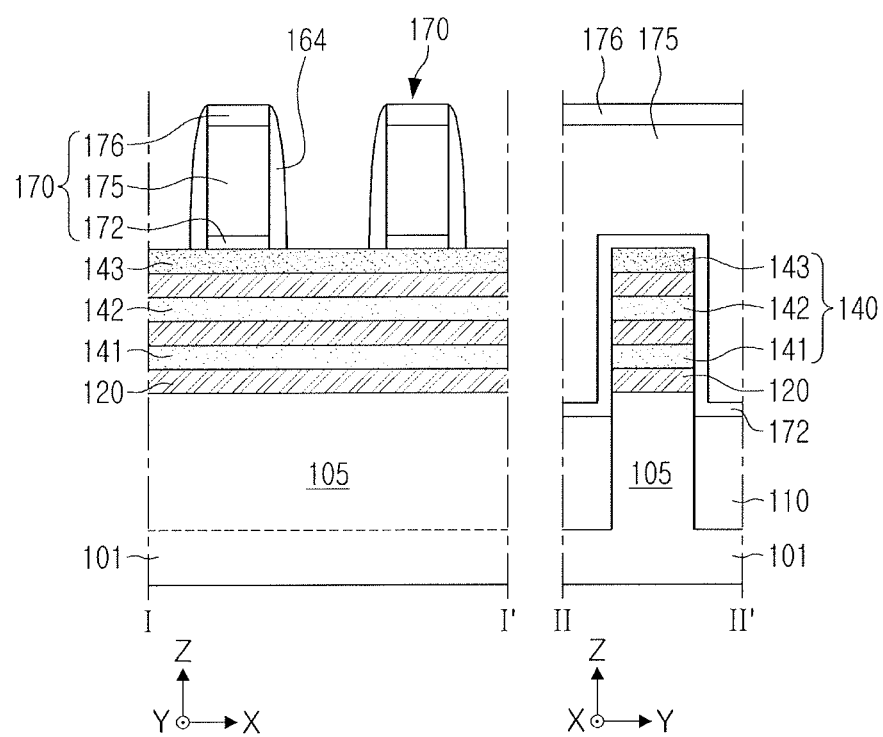

Referring to FIG. 11C, sacrificial gate structures 170 and gate spacer layers 164 may be formed on the active structures.

The sacrificial gate structures 170 may be sacrificial structures formed in a region in which the gate dielectric layer 162 and the gate electrode 165 are disposed in upper portions of the channel structures 140. The sacrificial gate structures 170 may include first and second sacrificial gate layers 172 and 175, sequentially layered, and a mask pattern layer 176. The first and second sacrificial gate layers 172 and 175 may be patterned using the mask pattern layer 176. The first and second sacrificial gate layers 172 and 175 may be an insulating layer and a conductive layer, respectively, for example. The first and second sacrificial gate layers 172 and 175 may be configured to be integrated as a single layer. For example, the first sacrificial gate layer 172 may include a silicon oxide, and the second sacrificial gate layer 175 may include a poly silicon. The mask pattern layer 176 may include a silicon oxide and/or a silicon nitride. The sacrificial gate structures 170 may have a line form intersecting the active structures and extending in one direction. For example, the sacrificial gate structures 170 may extend in the y direction, and may be spaced apart from each other in the x direction.

The gate spacer layers 164 may be on both side walls of the sacrificial gate structures 170. The gate spacer layers 164 may be formed by forming a film having a uniform thickness along upper surfaces and side surfaces of the sacrificial gate structures 170 and the active structures and performing an anisotropic etching process. The gate spacer layers 164 may be formed of a low-k material, and may include at least one of SiO, SiN, SiCN, SiOC, SiON, and SiOCN.

Figure 11D:
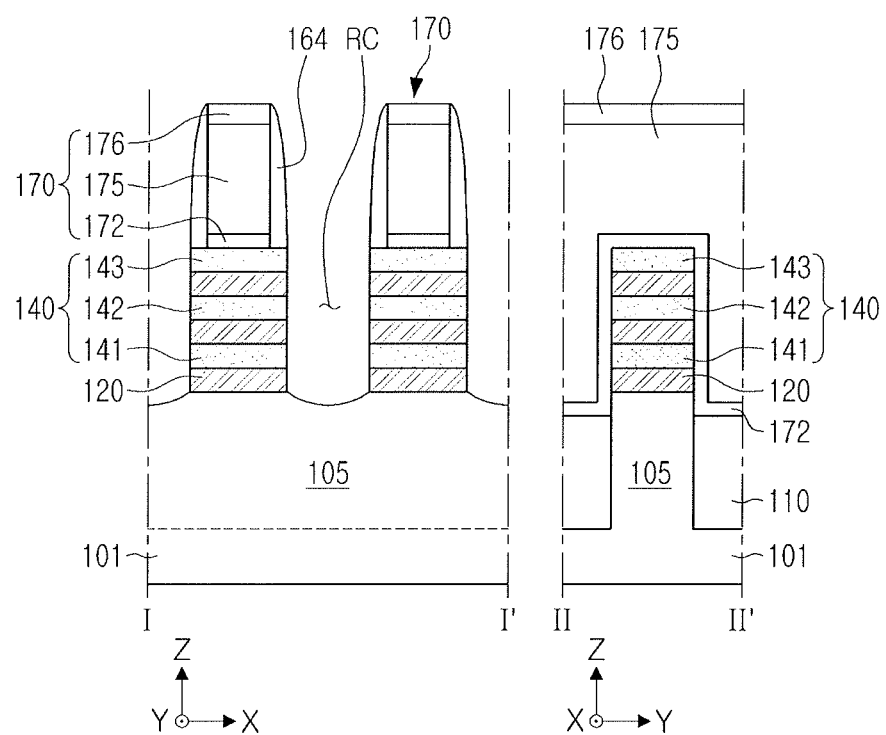

Referring to FIG. 11D, a recess region RC may be formed by removing exposed sacrificial layers 120 and a plurality of channel layers 141, 142, and 143 between the sacrificial gate structures 170, thereby forming channel structures 140.

The exposed sacrificial layers 120 and the plurality of channel layers 141, 142, and 143 may be removed using the sacrificial gate structures 170 and the gate spacer layers 164 as masks. Accordingly, each of the plurality of channel layers 141, 142, and 143 may have a defined length in the x direction and may form the channel structure 140. As illustrated in FIG. 10B, the sacrificial layers 120 and the channel structure 140 may be partially removed from side surfaces of the sacrificial gate structures 170 in lower portions of the sacrificial gate structures 170, and both side surfaces taken in the x direction may be disposed in lower portions of the sacrificial gate structures 170 or the gate spacer layers 164.

Figure 11E:
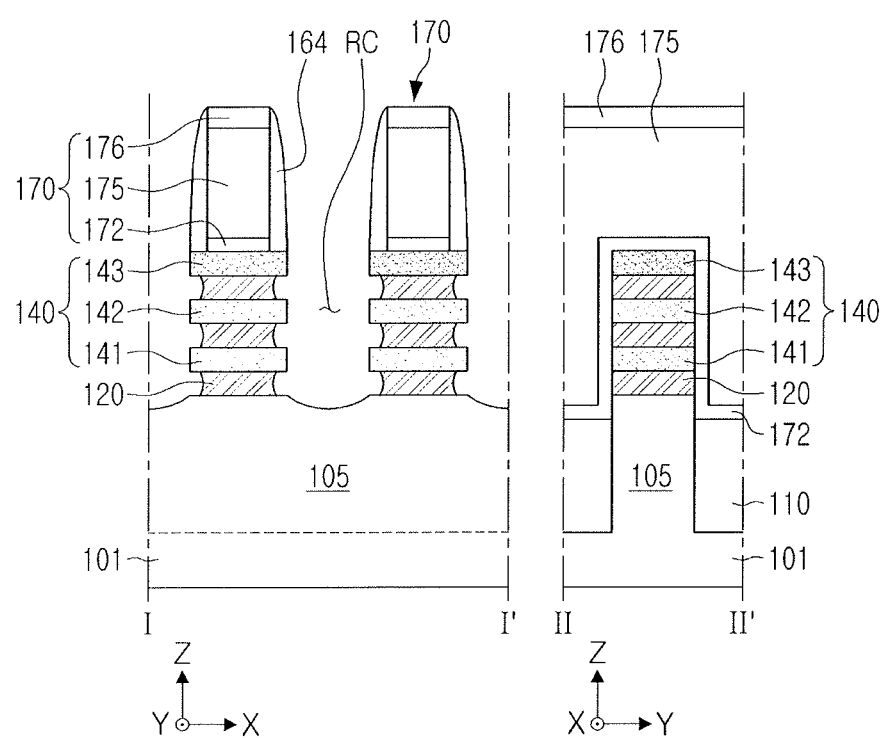

Referring to FIG. 11E, the exposed sacrificial layers 120 may be partially removed from a side surface.

The sacrificial layers 120 may be selectively etched with reference to the channel structures 140 by a wet etching process and may be removed to a certain depth from the side surface taken in the x direction. The sacrificial layers 120 may have, for example, inwardly recessed side surfaces by the side surface etching process as described above.

Figure 11F:
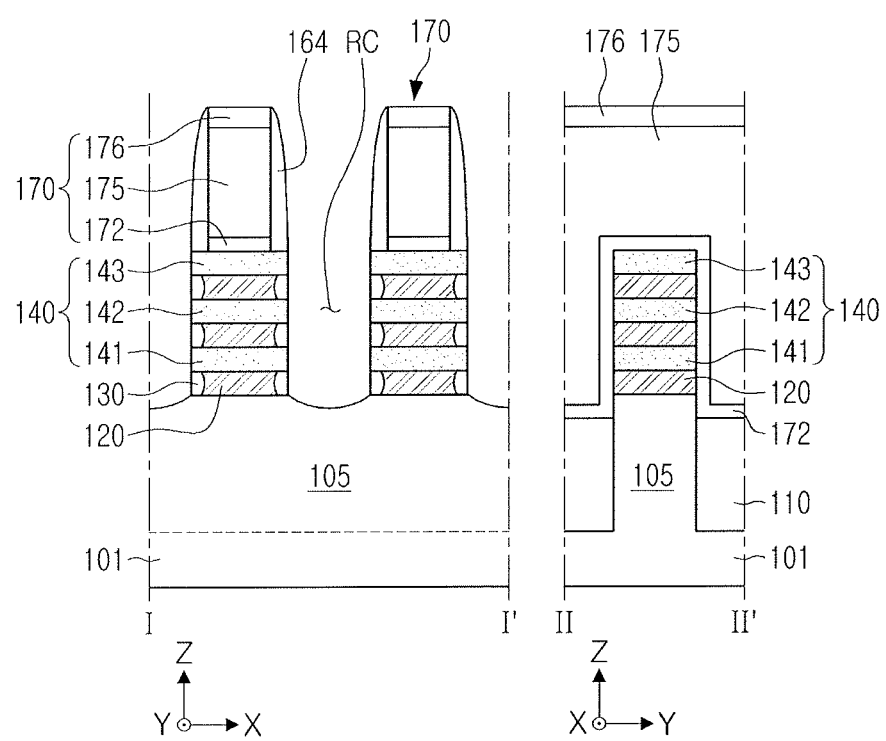

Referring to FIG. 11F, internal spacer layers 130 may be formed in the region from which the sacrificial layers 120 are removed.

The internal spacer layers 130 may be formed by filling the region from which the sacrificial layers 120 are removed with an insulating material, and removing the insulating material deposited in external regions of the channel structures 140. The internal spacer layers 130 may be formed of a material the same as a material of the gate spacer layers 164, for example. For example, the internal spacer layers 130 may include at least one of SiN, SiCN, SiOCN, SiBCN, and SiBN.

Figure 11G:
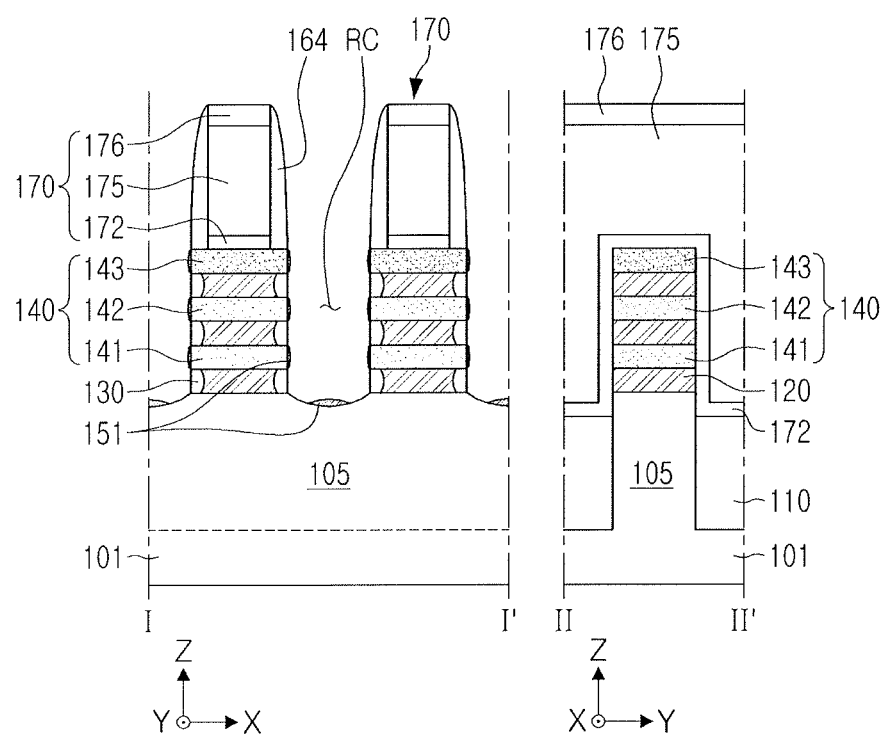

Referring to FIG. 11G, third epitaxial layers 151 for forming source/drain regions 150a may be disposed in the recess region RC on both side regions of the sacrificial gate structures 170.

The third epitaxial layers 151 may be formed on side surfaces of the first to third channel layers 141, 142, and 143 by an SEG process, and may also be formed in the active region 105 on a bottom surface of the recess region RC. The third epitaxial layers 151 may include impurities in a concentration lower than a concentration of impurities included in the first and second epitaxial layers 152 and 154 formed in a subsequent process. As in the example embodiment illustrated in FIG. 2, however, the process for forming the third epitaxial layers 151 may not be performed in example embodiments.

Figure 11H:
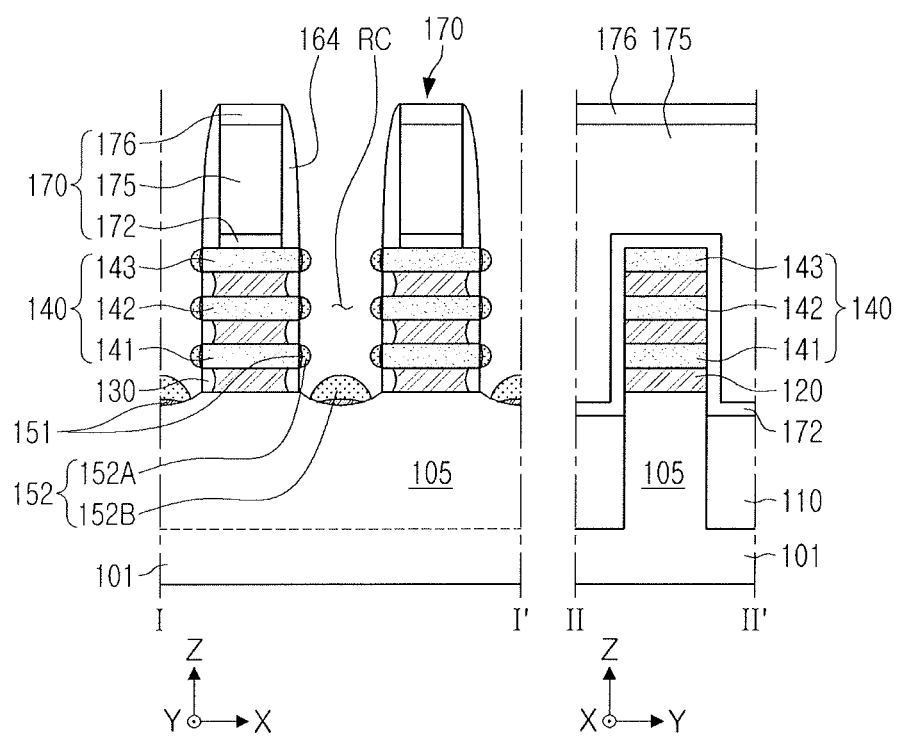

Referring to FIG. 11H, the first epitaxial layers 152 of the source/drain regions 150a may be formed in the recess region RC.

The first epitaxial layers 152 may be formed by an epitaxial growth from the third epitaxial layers 151, and may include impurities by an in-situ doping process. The first epitaxial layers 152 may be an SiAs layer, an SiP layer, an SiPC layer, an SiC layer, an SiPAs layer, or an SiGeP layer. First layers 152A of the first epitaxial layers 152 may be formed on side surfaces of the first to third channel layers 141, 142, and 143, and a second layer 152B may be formed on the third epitaxial layers 151 on a bottom surface of the recess region RC. The first layers 152A may be formed to have externally curved surfaces, curved from side surfaces of the first to third channel layers 141, 142, and 143, for example. The second layer 152B may be configured to have an upwardly curved surface on a surface of the active region 105 on a bottom surface of the recess region RC, for example. In an example embodiment illustrated in FIGS. 7 and 9, the manufacturing process may be performed while controlling a growth speed and a growth thickness of the first epitaxial layer 152 in the above-described process.

Figure 11I:
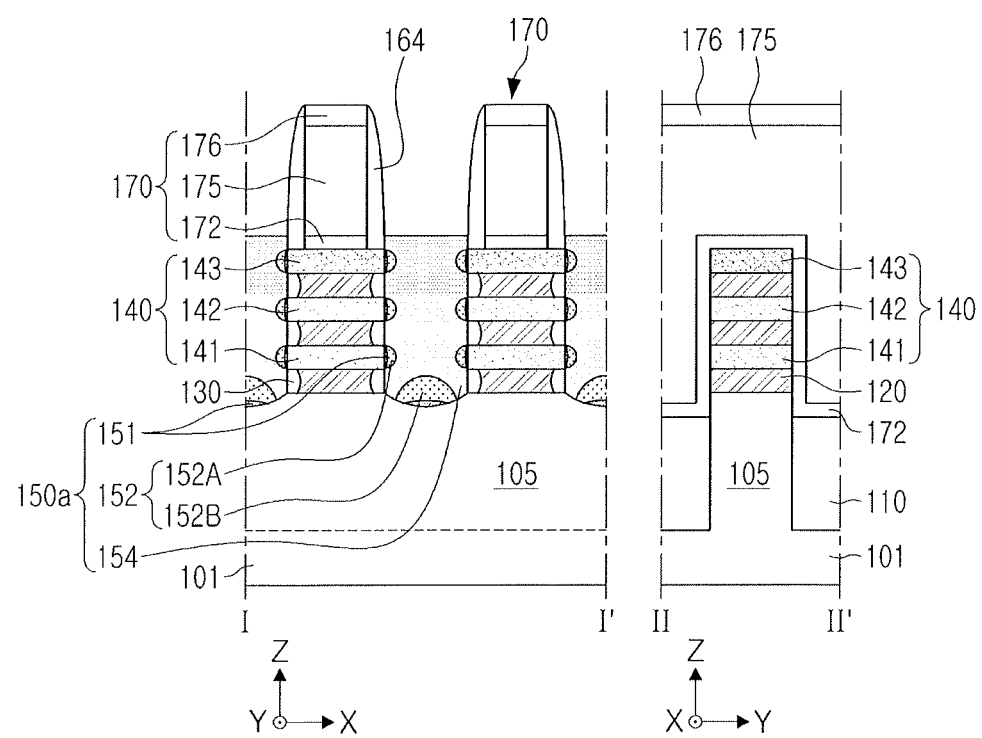

Referring to FIG. 11I, the second epitaxial layer 154 of the source/drain region 150a may be formed to fill the recess region RC.

The second epitaxial layer 154 may be grown from the first epitaxial layers 152 and the active region 105 using, for example, an SEG process, and may be configured as an in-situ doped semiconductor layer, for example, an SiP layer, for example. A concentration of phosphorus (P) included in the second epitaxial layer 154 may be higher than a concentration of arsenic (As) or phosphorus (P) included in the first epitaxial layers 152.

The second epitaxial layer 154 may have a form similar to an oval along with the first epitaxial layer 152, and an upper surface of the second epitaxial layer 154 may be formed to be planar. The second epitaxial layer 154 may be formed to fill a space between the first epitaxial layers 152 disposed upwardly and downwardly in the z direction, and may be formed to fill a space between the first epitaxial layers 152 on both side surfaces of the recess region RC in the x direction.

In the source/drain region 150a, the first to third epitaxial layers 151, 152, and 154 may be epitaxially grown. Thus, in the source/drain region 150a formed through the processes described above, boundaries among the first to third epitaxial layers 151, 152, and 154 may not be distinct in a microscope image. However, as compositions of the first to third epitaxial layers 151, 152, and 154 are different from one another, the first to third epitaxial layers 151, 152, and 154 may be substantially distinguished from one another through an analysis such as a transmission electron microscopy energy-dispersive X-ray spectroscopy (TEM-EDX) analysis, and the like.

Figure 11J:
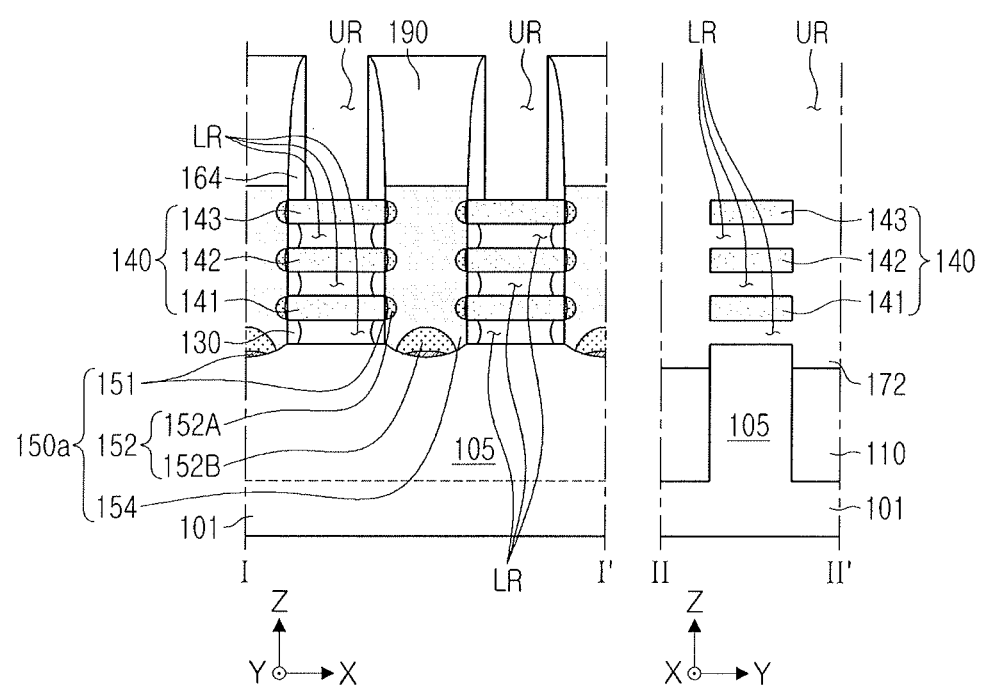

Referring to FIG. 11J, an interlayer insulating layer 190 may be formed, and the sacrificial layers 120 and the sacrificial gate structures 170 may be removed.

The interlayer insulating layer 190 may be formed by forming an insulating film covering the sacrificial gate structures 170 and the source/drain regions 150a and performing a planarization process.

The sacrificial layers 120 and the sacrificial gate structures 170 may be selectively removed with respect to the gate spacer layers 164, the interlayer insulating layer 190, and the channel structures 140. Upper gap regions UR may be formed by removing the sacrificial gate structures 170, and lower gap regions LR may be formed by removing the sacrificial layers 120 exposed through the upper gap regions UR. For example, when the sacrificial layers 120 include silicon-germanium (Ge), and the channel structure 140 includes silicon (Si), the sacrificial layers 120 may be selectively removed by performing a wet etching process using peracetic acid as an etchant. During the removing process, the source/drain regions 150s may be protected by the interlayer insulating layers 190 and the internal spacer layers 130.

Figure 11K:
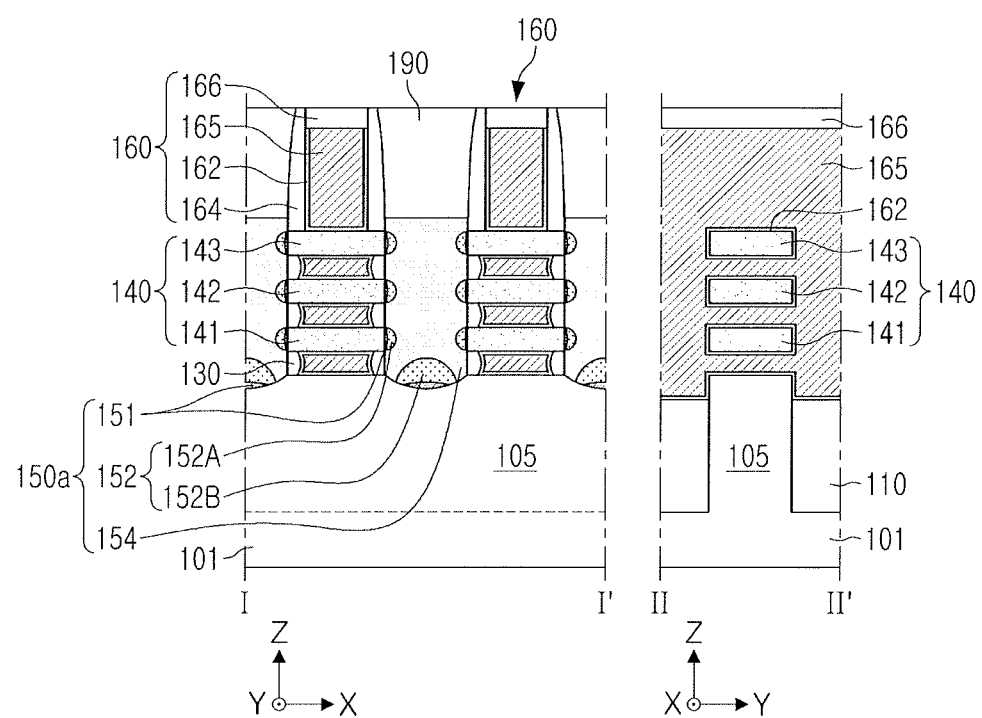

Referring to FIG. 11K, the gate structures 160 may be disposed in the upper gap regions UR and the lower gap regions LR.

The gate dielectric layers 162 may be formed to conformally cover internal surfaces of the upper gap regions UR and the lower gap regions LR. The gate electrodes 165 may be formed to completely fill the upper gap regions UR and the lower gap regions LR, and may be removed to a certain depth from upper portions of the upper gap regions UR. A gate capping layer 166 may be formed in the region from which the gate electrodes 165 are removed in the upper gap regions UR. Accordingly, the gate structures 160 including the gate dielectric layer 162, the gate electrode 165, the gate spacer layers 164, and the gate capping layer 166 may be formed.

Referring back to FIG. 2, a contact plug 180 may be formed.

A contact hole may be formed by patterning the interlayer insulating layer 190, and the contact plug 180 may be formed by filling the contact hole with a conductive material. A lower surface of the contact hole may be recessed into the source/drain regions 150a or may have flexures formed along upper surfaces of the source/drain regions 150a. In an example embodiment, a shape and a position of the contact plug 180 may be varied.

Figure 12:
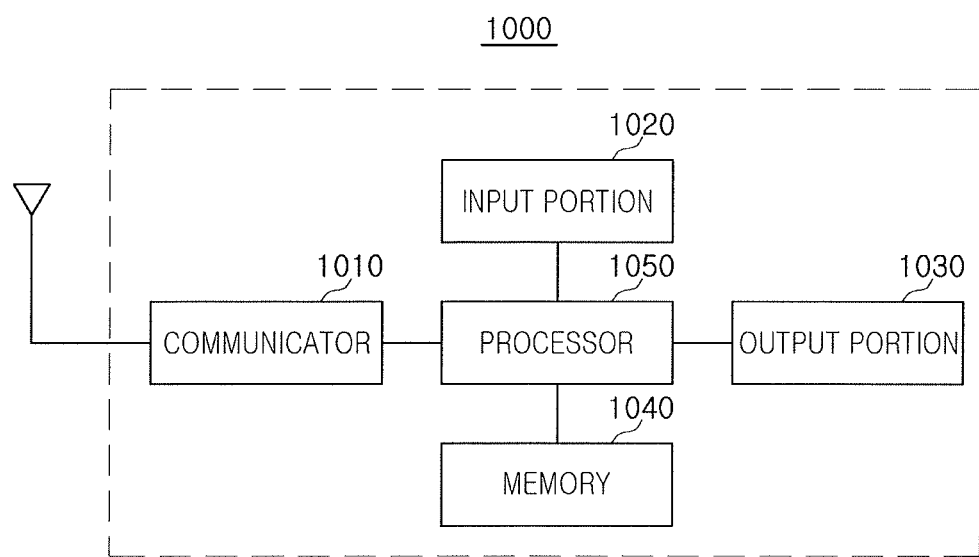
FIG. 12 illustrates a block diagram of an electronic device including a semiconductor device according to an example embodiment.

FIG. 12 is a block diagram illustrating an electronic device including a semiconductor device according to an example embodiment.

Referring to FIG. 12, an electronic device 1000 in an example embodiment may include a communicator 1010, an input portion 1020, an output portion 1030, a memory 1040, and a processor 1050.

The communicator 1010 may include a wired/wireless communication module, and may include a wireless internet module, a near field communication module, a GPS module, a mobile communication module, and the like. A wired/wireless communication module included in the communicator 1010 may be connected to an external communication network based on various communication standards and may transmit and receive data.

The input portion 1020 may be a module provided for a user to control operations of the electronic device 1000, and may include a mechanical switch, a touch screen, a voice recognition module, and the like. The input portion 1020 may also include a mouse operating using a track ball or a laser pointer method, or a finger mouse device, and may further include various sensor modules through which a user may input data.

The output portion 1030 may output information processed in the electronic device 1000 in a form of voice or an image, and the memory 1040 may store a program for a processing operation and a control operation of the processor 1050, data, or the like. The processor 1050 may transfer a command word to the memory 1040 in accordance with a required operation and may store or read out data.

The memory 1040 may be embedded in the electronic device 1000 or may communicate with the processor 1050 using a separate interface. When the memory 1040 communicates with the processor 1050 using a separate interface, the processor 1050 may store data in the memory 1040 or may read out data from the memory 1040 through various interface standards such as SD, SDHC, SDXC, MICRO SD, USB, and the like.

The processor 1050 may control an operation of each component included in the electronic device 1000. The processor 1050 may perform a control operation or a processing operation in relation to a voice call, a video call, data communications, and the like, or may perform a control operation or a processing operation in relation to reproduction and management of multimedia. The processor 1050 may also process an input transferred from a user through the input portion 1020, and may output the result through the output portion 1030. Also, the processor 1050 may store data required for controlling operations of the electronic device 1000 in the memory 1040 or may read out the data from the memory 1040. At least one of the processor 1050 and the memory 1040 may include a semiconductor device described in the aforementioned example embodiments described with reference to FIGS. 1 to 10C.

Figure 13:
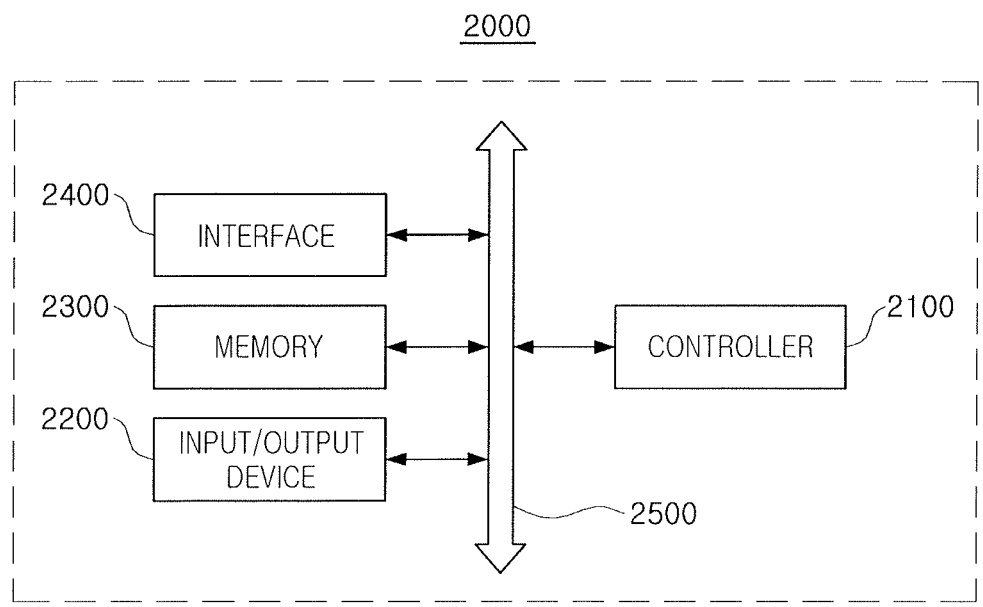
FIG. 13 illustrates a diagram of a system including a semiconductor device according to an example embodiment.

FIG. 13 is a diagram illustrating a system including a semiconductor device according to an example embodiment.

Referring to FIG. 13, a system 2000 may include a controller 2100, an input/output device 2200, a memory 2300, and an interface 2400. The system 2000 may be a mobile system or may be a system transmitting or receiving information. The mobile system may be implemented as a PDA, a portable computer, a web tablet, a wireless phone, a mobile phone, a digital music player, or a memory card.

The controller 2100 may execute a program, and may control the system 2000. The controller 2100 may be implemented as a microprocessor, a digital signal processor, a microcontroller, or another similar device.

The input/output device 2200 may be used to input and output data of the system 2000. The system 2000 may be connected to an external device, such as a personal computer or a network, using the input/output device 2200, and may exchange data with the external device. The input/output device 2200 may be implemented as a keypad, a keyboard, or a display.

The memory 2300 may store a code and/or data for operating the controller 2100, and/or may store data processed in the controller 2100.

The interface 2400 may be a data transmission path between the system 2000 and an external device. The controller 2100, the input/output device 2200, the memory 2300, and the interface 2400 may communicate with one another through a bus 2500.

At least one of the controller 2100 and the memory 2300 may include a semiconductor device described in the aforementioned example embodiments described with reference to FIGS. 1 to 10C.

According to the aforementioned example embodiments, by controlling the structure of the source/drain region, a semiconductor device having improved electrical properties may be provided.

As described above, example embodiments may provide a semiconductor device having improved electrical properties.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
an active region extending in a first direction on a substrate;
a plurality of channel layers on the active region and spaced apart from each other vertically;
a gate structure extending in a second direction on the substrate and surrounding the plurality of channel layers;
internal spacer layers covering side surfaces of the gate structure in the first direction in a lower portion of each of the plurality of channel layers, the internal spacer layers having internal side surfaces facing the gate structure and curved towards the gate structure in the first direction; and
a source/drain region on the active region at a side of the gate structure, the source/drain region being in contact with the plurality of channel layers and extending more upwardly than an uppermost surface of the plurality of channel layers, the source/drain region including:
first epitaxial layers including arsenic (As) and including first layers on side surfaces of the plurality of channel layers in the first direction and a second layer on the active region at a lower end of the source/drain region; and
a second epitaxial layer on the first epitaxial layer, the second epitaxial layer filling spaces between the first epitaxial layers and including phosphorus (P),
wherein the second layer has a first thickness in an edge region adjacent to the plurality of channel layers and has a second thickness, greater than the first thickness, in a center region in the first direction, and
wherein the gate structure includes a gate electrode having a first width in the first direction on the uppermost surface of the plurality of channel layers and having a second width in the first direction, greater than the first width, below the plurality of channel layers.

2. The semiconductor device as claimed in claim 1, wherein the second epitaxial layer is interposed between the first epitaxial layers in the first direction and is interposed between the first epitaxial layers in a third direction, which is a vertical direction perpendicular to the first direction and the second direction.

3. The semiconductor device as claimed in claim 2, wherein the first layers are separated from each other between the plurality of channel layers disposed in the third direction and are separated from the second layer.

4. The semiconductor device as claimed in claim 1, wherein each of the first epitaxial layers includes arsenic (As) in a first concentration, and the second epitaxial layer includes phosphorus (P) in a second concentration higher than the first concentration.

5. The semiconductor device as claimed in claim 1, wherein a concentration of arsenic (As) included in the first epitaxial layers is in a range of approximately $2\times10^{20}/cm^3$ to $8\times10^{20}/cm^3$.

6. The semiconductor device as claimed in claim 1, wherein a concentration of phosphorus (P) included in the second epitaxial layer is in a range of approximately $3.1\times 10^{21}/cm^3$ to $3.9\times10^{21}/cm^3$.

7. The semiconductor device as claimed in claim 1, wherein at least portions of the first epitaxial layers overlap the second epitaxial layer on a plane.

8. The semiconductor device as claimed in claim 1, wherein the internal spacer layers have external side surfaces substantially coplanar with the side surfaces of the plurality of channel layers.

9. The semiconductor device as claimed in claim 1, wherein the first layers protrude towards the second epitaxial layer from a side surface formed by the internal spacer layers and the plurality of channel layers.

10. The semiconductor device as claimed in claim 1, wherein each of the first layers has a side surface facing the second epitaxial layer and curved towards the second epitaxial layer in the first direction.

11. The semiconductor device as claimed in claim 1, wherein side surfaces of the first layers taken in the first direction are surrounded by the second epitaxial layer, the plurality of channel layers, and the internal spacer layers.

12. The semiconductor device as claimed in claim 1, wherein the second layer has an upper surface curved towards the second epitaxial layer.

13. The semiconductor device as claimed in claim 1, wherein the first layers have a first maximum thickness at the side surfaces of the plurality of channel layers, and
wherein the second layer has a second maximum thickness, greater than the first maximum thickness, at an upper surface of the active region.

14. The semiconductor device as claimed in claim 1, wherein at least portions of the first epitaxial layers overlap the gate structure on a plane.

15. A semiconductor device, comprising:
an active region;
a plurality of channel layers on the active region and spaced apart from each other vertically;
a gate structure extending in a second direction and surrounding the plurality of channel layers;
a source/drain region on the active region at a side of the gate structure, the source/drain region being in contact with the plurality of channel layers, the source/drain region including:
a first epitaxial layer having a first composition, extending along side surfaces of the plurality of channel layers in a first direction, and covering an upper surface of the active region at a lower end of the source/drain region; and
a second epitaxial layer on the first epitaxial layer, the second epitaxial layer having a second composition different from the first composition and extending more upwardly than an uppermost surface of the plurality of channel layers,
wherein the first epitaxial layer has flexures formed by non-uniform thickness, and the first epitaxial layer has a first thickness on the side surfaces of the plurality of channel layers and has a second thickness, greater than the first thickness, on the upper surface of the active region.

16. The semiconductor device as claimed in claim 15, wherein the first epitaxial layer has a third thickness on side surfaces of gate structure in a lower portion of each of the plurality of channel layers in the first direction, and the third thickness is different from the first thickness.

17. The semiconductor device as claimed in claim 16, wherein the second thickness is greater than the third thickness.

18. The semiconductor device as claimed in claim 15, wherein the first epitaxial layer surrounds a lower surface and side surfaces of the second epitaxial layer in the first direction.

19. The semiconductor device as claimed in claim 18, wherein the second epitaxial layer is spaced apart from the active region by the first epitaxial layer.

20. The semiconductor device as claimed in claim 15, further comprising:
   a contact plug connected to the source/drain region, wherein the first epitaxial layer is spaced apart from the contact plug.

* * * * *